United States Patent
Wang et al.

(10) Patent No.: US 8,243,177 B2
(45) Date of Patent: Aug. 14, 2012

(54) WAFER-SCALE CLUSTER IMAGE SENSOR CHIP AND METHOD WITH REPLICATED GAPLESS PIXEL LINE AND SIGNAL READOUT CIRCUIT SEGMENTS

(75) Inventors: Weng-Lyang Wang, Saratoga, CA (US); Shengmin Lin, Santa Clara, CA (US)

(73) Assignee: CMOS Senor, Inc., Cupertino, CA (US)

( * ) Notice: Subject to any disclaimer, the term of this patent is extended or adjusted under 35 U.S.C. 154(b) by 416 days.

(21) Appl. No.: 12/641,597

(22) Filed: Dec. 18, 2009

(65) Prior Publication Data

US 2011/0149132 A1    Jun. 23, 2011

(51) Int. Cl.
*H04N 3/14* (2006.01)
*H01L 21/44* (2006.01)
(52) U.S. Cl. .......................... 348/294; 438/598
(58) Field of Classification Search .................. 348/294, 348/301, 332, 282; 438/598
See application file for complete search history.

(56) References Cited

U.S. PATENT DOCUMENTS 5,241,377 A * 8/1993 Kaneda .......................... 348/265
5,784,101 A * 7/1998 Hasegawa ..................... 348/282

* cited by examiner

*Primary Examiner* — Aung S Moe
*Assistant Examiner* — Mekonnen Dagnew
(74) *Attorney, Agent, or Firm* — Chein-Hwa Tsao; CH Emily LLC (57) ABSTRACT

A multi-pixel row wafer-scale cluster image sensor chip (WCISC) is proposed. Expressed in X-Y-Z coordinates with its pixel rows along X-axis, the WCISC converts areal image frame (IMFM) into areal image frame signal (AIFS). The WCISC includes multiple imaging pixel rows $PXRW_1, \ldots, PXRW_M$. Each $PXRW_i$ has photoelectrical sensing elements spanning pixel row width $PRW_i$ and producing a pixel row image signal $PRIS_i$. Each $PXRW_i$ is offset from $PXRW_1$ by distance $XOFST_i$ and spaced from $PXRW_{i-1}$ by distance $SP_{i-1,i}$ such that X- and Y-extremities of $(PXRW_1, \ldots, PXRW_M)$ define IMFM. The WCISC is so configured that any image pixel sweeping through IMFM will be sensed by at least one imaging pixel row. In the presence of Y-directional relative motion between WCISC and IMFM and an external electronic imaging controller (EEIC) interfacing with the WCISC, the EEIC can extract all $PRIS_i$ from WCISC and reconstruct the AIFS.

18 Claims, 13 Drawing Sheets

Present Invention

Fig. 1 Present Invention

Fig. 2 Present Invention

Fig. 3 Present Invention

Fig. 4A Present Invention

Fig. 4B Present Invention

Fig. 4C Present Invention

Fig. 4D Present Invention

Fig. 4E Present Invention

Fig. 5A Present Invention

Fig. 5B Present Invention

Fig. 5C Present Invention

Fig. 6A Present Invention

Fig. 6B Present Invention

WAFER-SCALE CLUSTER IMAGE SENSOR CHIP AND METHOD WITH REPLICATED GAPLESS PIXEL LINE AND SIGNAL READOUT CIRCUIT SEGMENTS

CROSS REFERENCE TO RELATED APPLICATION

This invention is related to the following previously filed US patent application:
Title: "Wafer-scale Linear Image Sensor Chip and Method with Replicated Gapless Pixel Line and Signal Readout Circuit Segments" by Weng-Lyang Wang, Shengmin Lin, Chi-Pin Lin, Feng-Ke Hsiao with U.S. patent application Ser. No. 12/506,254 and hereinafter referred to as U.S. Ser. No. 12/506,254
whose contents are incorporated herein by reference for any and all purposes.

BACKGROUND OF THE INVENTION

1. Field of the Invention

The present invention relates to electronic imaging. More particularly, the present invention is related to the structural design of a wafer-scale cluster image sensor chip and method of making.

2. Related Background Art

An important trend of electronic imaging with an areal image sensor chip is the increase of total imaging field size while preserving high pixel-pixel registration accuracy within the chip, ideally absent of any anomalous inter-pixel gaps. Other than a fundamental limitation imposed upon the total imaging field size by the semiconductor wafer size, another potential indirect limitation on the total imaging field size comes from a maximum allowable imaging field size (MIFS) of a wafer processing foundry fabricating the semiconductor wafer and this was already illustrated in U.S. Ser. No. 12/506,254. More specifically, the MIFS is the maximum allowable single imaging field size of a precision step-and-repeat photolithographic imaging equipment defining the specific integrated circuit pattern to be created out of the wafer. Here, a specific MIFS is characterized by a maximum allowable imaging field size $MIFS_X$ along the X-direction and a maximum allowable imaging field size MIFS along the Y-direction. Similar to U.S. Ser. No. 12/506,254 however further extended to areal imaging, the primary object of the present invention to provide an areal cluster image sensor chip for a large imaging field size exceeding the MIFS without anomalous inter-pixel gaps while avoiding the problem of low wafer imaging throughput associated with wafer stitching technology.

SUMMARY OF THE INVENTION

A multi-pixel row wafer-scale cluster image sensor chip (WCISC) is proposed. Expressed in an X-Y-Z Cartesian coordinate system with pixel rows of the WCISC oriented along X-axis and its principal chip surface lying in X-Y plane, the WCISC photoelectrically converts an areal image frame (IMFM) of width IFW and height IFH in X-Y plane into an areal image frame signal (AIFS). The WCISC includes:
A number of imaging pixel rows $PXRW_1$, $PXRW_2$, ..., $PXRW_i$, ..., $PXRW_M$. Each pixel row $PXRW_i$ has numerous photoelectrical sensing elements (PESE) spanning a pixel row width $PRW_i$ and producing a corresponding pixel row image signal $PRIS_i$. Each $PXRW_i$ is:

a) Offset from $PXRW_1$ along X-direction by a distance $XOFST_i$.
b) Spaced from $PXRW_{i-1}$ along Y-direction by a distance $SP_{i-1,i}$.

Such that the X- and Y-extremities of ($PXRW_1$, ..., $PXRW_M$) define the IMFM. The widths $PRW_i$ and distances $XOFST_i$ are also chosen such that any image pixel sweeping through the IMFM along Y-direction will cross hence will be photoelectrically sensed by at least one imaging pixel row. As a result:

1. In the presence of a Y-directional relative motion between WCISC and IMFM and an external electronic imaging controller (EEIC) interfacing with the WCISC, the EEIC can extract all the $PRIS_i$ from the WCISC and reconstruct the AIFS.
2. Owing to its configurational flexibility, the WCISC can be made with correspondingly higher wafer level yield thus lower cost.

Under a more specific class of embodiments ($PRW_1=PRW_2=...=PRW_M$) and ($XOFST_2=XOFST_3=...=XOFST_M=0$). Each $PXRW_i$ photoelectrically converts a pixel line image (PLI) of width $PRW_i$ into the $PRIS_i$. Importantly, each $PXRW_i$ is made of an X-direction linear array of contiguous sensor segments $SS_1$, $SS_2$, ..., $SS_j$, ..., $SS_N$ (N>1) spaced at a scribe pitch (SCP). Each $SS_j$ further includes:

c) A gapless local pixel line segment ($LPLS_j$) of $PESE_{j1}$, $PESE_{j2}$, ..., $PESE_{jk}$, ..., $PESE_{jP}$ (P>=1) spaced at a sensor element pitch (SEP) for:
  c1) Converting a corresponding local segment of the $PRIS_i$ into a raw image segment signal set ($RISS_j$).
  c2) Forming a gapless global pixel line (GPL) corresponding to the $PRIS_i$.
d) A readout circuit segment ($RCS_j$) coupled to the $LPLS_j$ for processing the $RISS_j$ into a readout image segment signal set ($ROSS_j$). The $RCS_j$ further includes a set of contact pads ($CTP_j$) for off-chip signal interconnection.

Each $SS_j$ has the same structure in that each $LPLS_j$ and each $RCS_j$ are replicated across $SS_1$, $SS_2$, ..., $SS_N$. Thus, upon a pre-determined configuration of off-chip interconnection of the contact pad set ($CTP_1$, ..., $CTP_N$) so as to compose the ($ROSS_1$, ..., $ROSS_N$) into the $PRIS_i$, each $PXRW_i$ functions as a key imaging portion of the WCISC.

In a more detailed embodiment, each $PXRW_i$ further includes two dicing margins $DCM_1$ and $DCM_N$ located respectively contiguous to $SS_1$ and $SS_N$.

To maintain a good lithographic mask imaging throughput during its wafer manufacturing process, each $SS_j$ is sized to be within a maximum allowable imaging field size of a step-and-imaging equipment while the range of X-extremities of ($PXRW_1$, ..., $PXRW_M$) is allowed to exceed the maximum allowable imaging field size. Likewise, $PXRW_1$, ..., $PXRW_M$ are also configured such that the range of Y-extremities of ($PXRW_1$, ..., $PXRW_M$) is less than a maximum allowable imaging field size of a step-and-imaging equipment.

In a more detailed embodiment, each $RCS_j$ further includes P pixel readout circuits $PRC_{jk}$ (k=1, 2, ..., P) each respectively coupled to a corresponding $PESE_{jk}$. At least one pair of neighboring pixel readout circuits $PRC_{jk}$, $PRC_{jk+1}$ are, referencing the Y-direction, placed at the opposite side of the $LPLS_j$ so as to relieve an X-direction circuit integration density of the $RCS_j$.

In a more detailed embodiment, each $PESE_{jk}$ is a photodiode and each $PRC_{jk}$ further includes a transfer control switch and a feedback-loop operational amplifier both coupled to the photodiode plus an in-pixel correlated double sampling (CDS) circuit.

In a more specific embodiment, the EEIC is configured to extract all the $PRIS_i$ from the WCISC in parallel so as to reconstruct the AIFS with a correspondingly higher imaging throughput.

In another more specific embodiment, the WCISC further includes a set of row-specific color filters atop the $PXRW_1$, $PXRW_2, \ldots, PXRW_i, \ldots, PXRW_M$ so as to make the EEIC a color IMFM imager.

Under an even more specific embodiment, the number of imaging pixel rows M is from about 3 to about 10. The SEP ranges from about 5 micron to about 100 micron. The number of photoelectrical sensing elements P ranges from about 100 to about 1000000.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

DETAILED DESCRIPTION OF THE PREFERRED EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1:
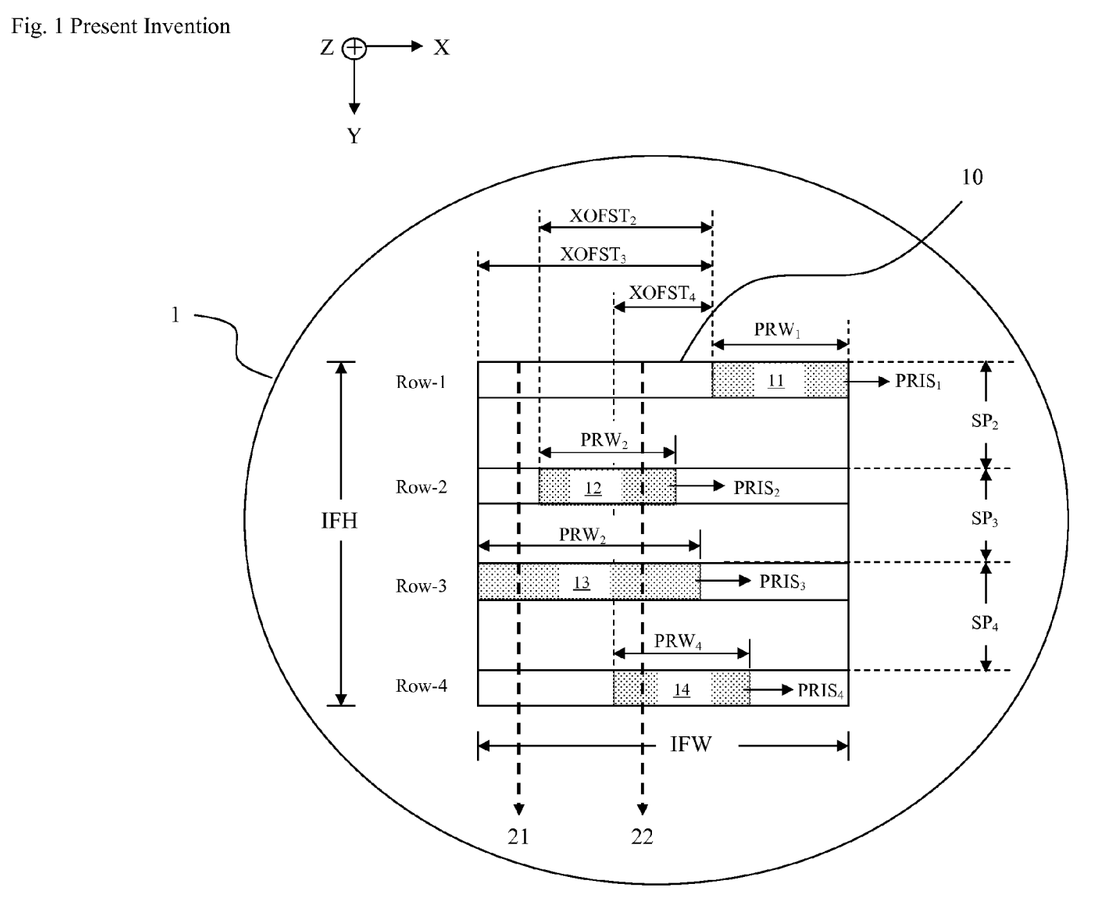
FIG. 1 illustrates an example of the present invention multi-pixel row wafer-scale cluster image sensor chip.

FIG. 1 illustrates an example of the present invention multi-pixel row wafer-scale cluster image sensor chip. The example 4-pixel row wafer-scale cluster image sensor chip (WCISC) 10 has its four pixel rows oriented along X-axis and its principal chip surface lying in X-Y plane. It is important to point out that the 4-pixel row WCISC 10 is processed, selected then separated from, after a successful wafer level functionality verification, a base wafer 1. As a remark, the chip separation can be effected through mechanical dicing or laser cutting. The 4-pixel row WCISC 10 photoelectrically converts an areal image frame (IMFM) of width IFW and height IFH in X-Y plane into an areal image frame signal (AIFS). The 4-pixel row WCISC 10 includes four imaging pixel rows $PXRW_1$ 11, $PXRW_2$ 12, $PXRW_3$ 13 and $PXRW_4$ 14. As will be presently described in more detail, each pixel row $PXRW_i$ contains numerous photoelectrical sensing elements (PESE) spanning a pixel row width $PRW_i$ and producing a corresponding pixel row image signal $PRIS_i$. In this example:

The imaging pixel rows $PXRW_1$ 11, $PXRW_2$ 12, $PXRW_3$ 13 and $PXRW_4$ 14 have respective pixel row widths $PRW_1$, $PRW_2$, $PRW_3$, $PRW_4$.

The imaging pixel rows $PXRW_2$ 12, $PXRW_3$ 13 and $PXRW_4$ 14 are respectively offset from the imaging pixel row $PXRW_1$ 11 along X-direction by distances $XOFST_2$, $XOFST_3$, $XOFST_4$.

Along the Y-direction, the neighboring imaging pixel rows are respectively spaced from each other by distances $SP_2$, $SP_3$, $SP_4$.

Thus, the Y-extremities of $PXRW_1$ 11 and $PXRW_4$ 14 define the IFH while the X-extremities of $PXRW_1$ 11 and $PXRW_3$ 13 define the IFW. While the edges of the 4-pixel row WCISC 10 are rectangular in shape, its functionality verified imaging pixel rows $PXRW_1$ 11, $PXRW_2$ 12, $PXRW_3$ 13 and $PXRW_4$ 14 can be configurationally quite irregular as demonstrated in this example. To those skilled in the art, owing to its configurational flexibility the 4-pixel row WCISC 10 can therefore be made with correspondingly higher wafer level yield thus lower cost. Notwithstanding this advantage, the above pixel row widths $PRW_1$, $PRW_2$, $PRW_3$, $PRW_4$ and offset distances $XOFST_2$, $XOFST_3$, $XOFST_4$ should still be chosen such that any image pixel sweeping through the IMFM along Y-direction will cross hence will be photoelectrically sensed by at least one imaging pixel row. for example, while a sweeping image pixel 22 will cross imaging pixel rows $PXRW_2$ 12, $PXRW_3$ 13, $PXRW_4$ 14, another sweeping image pixel 21 will only cross a single imaging pixel row $PXRW_3$ 13. Consequently, in the presence of a Y-directional relative motion between the 4-pixel row WCISC 10 and IMFM and an external electronic imaging controller (EEIC) interfacing with the 4-pixel row WCISC 10, the EEIC can extract all the $PRIS_i$ from the 4-pixel row WCISC 10 and reconstruct the AIFS with a single Y-scan.

Figure 2:
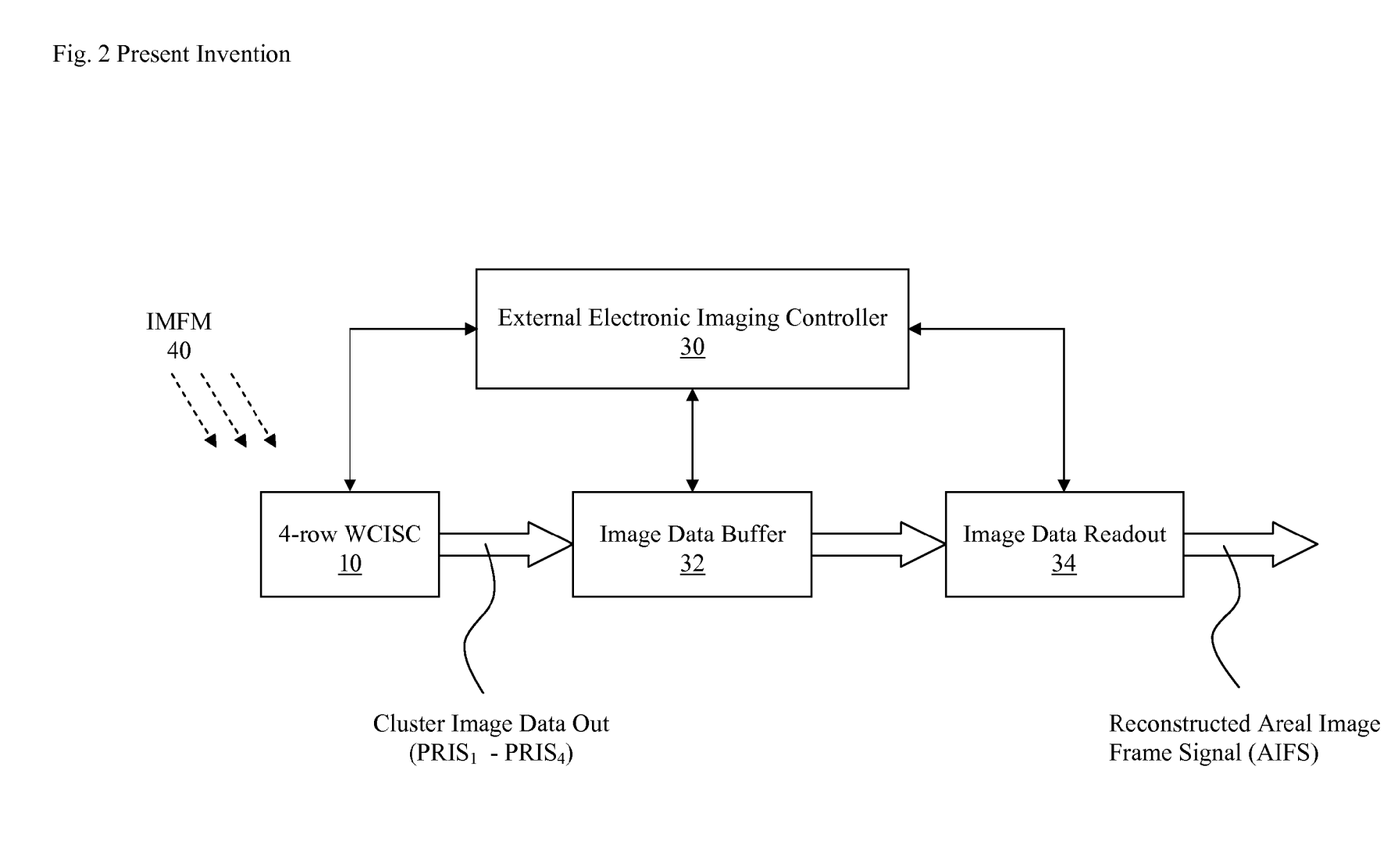
FIG. 2 is a top level system block diagram illustrating electronic areal imaging using the present invention multi-pixel row wafer-scale cluster image sensor chip.

FIG. 2 is a top level system block diagram illustrating electronic imaging of an IMFM 40 using the example 4-pixel row WCISC 10 under the present invention. An external electronic imaging controller (EEIC) 30 is provided that interfaces with the 4-pixel row WCISC 10. Additionally, an image data buffer 32 and an image data readout 34 are also provided to receive the pixel row image signals $PRIS_1$, $PRIS_2$, $PRIS_3$, $PRIS_4$ from the 4-pixel row WCISC 10, reconstruct and read out the AIFS under the control of the external electronic imaging controller (EEIC) 30.

Figure 3:
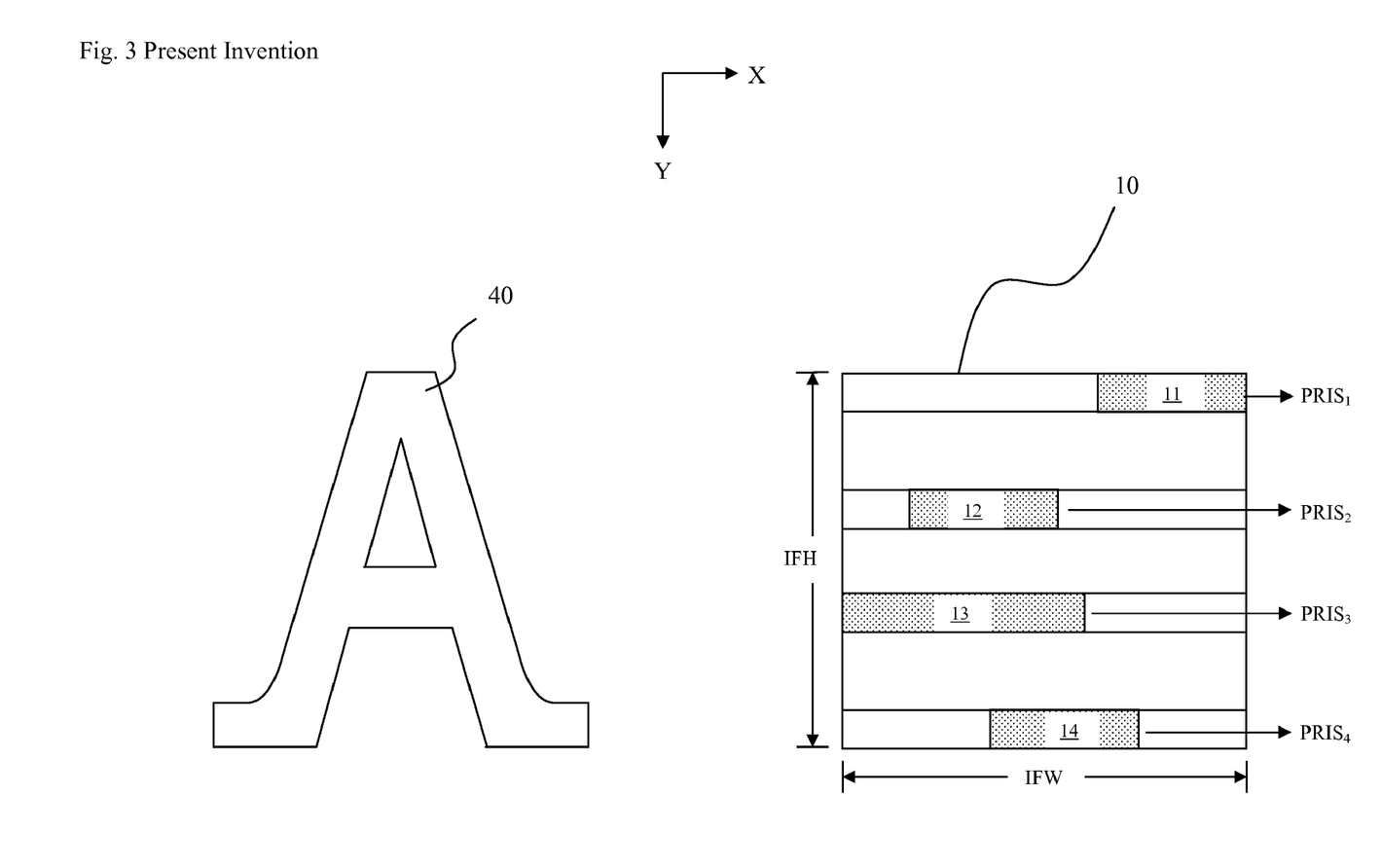
FIG. 3 illustrates an areal image frame to be scanned using the example of the present invention multi-pixel row wafer-scale cluster image sensor chip.
Figure 4A:
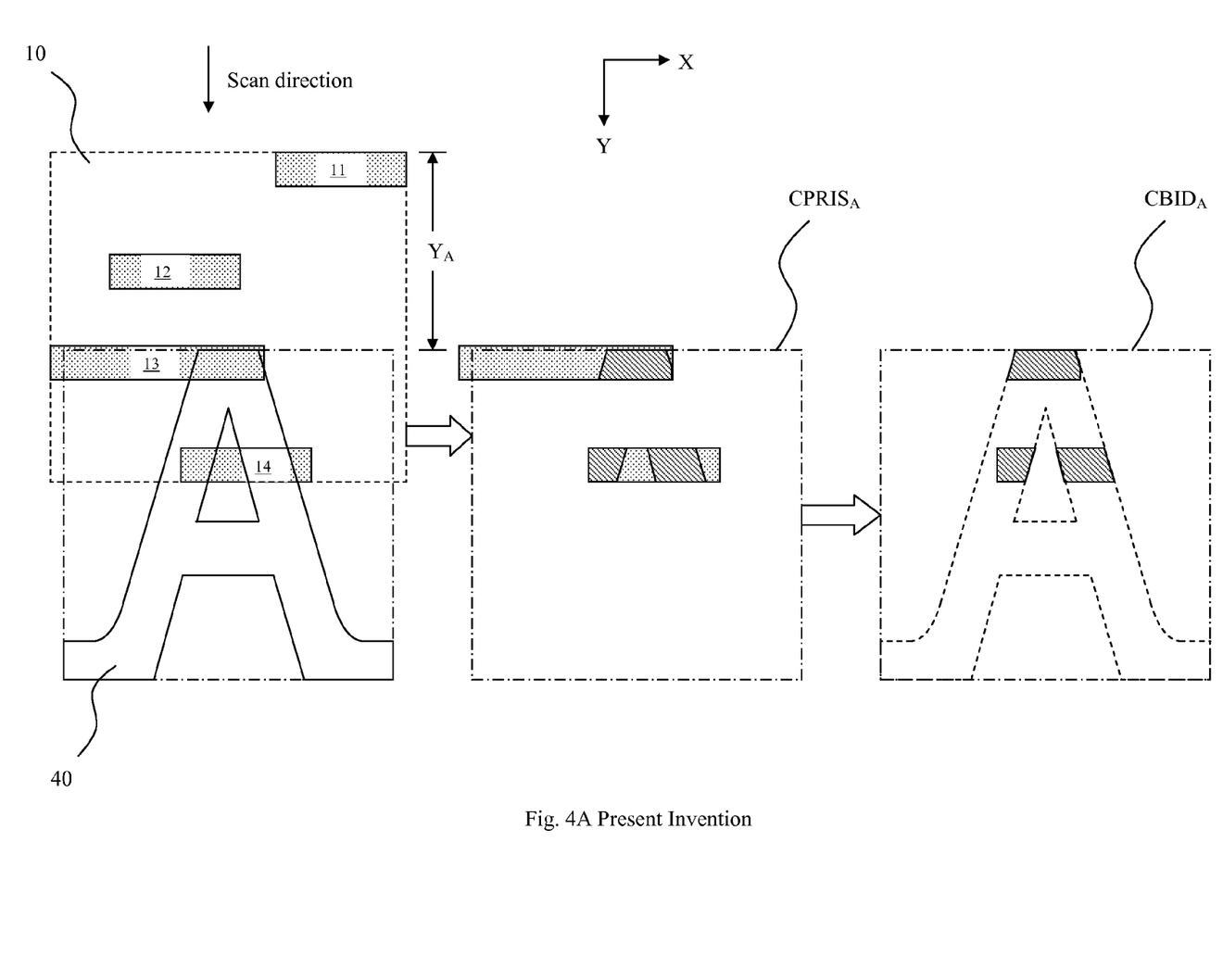
FIG. 4A through FIG. 4E illustrate an excerpted sequence of scanning the areal image frame till completion using the example of the present invention multi-pixel row wafer-scale cluster image sensor chip.
Figure 4B:
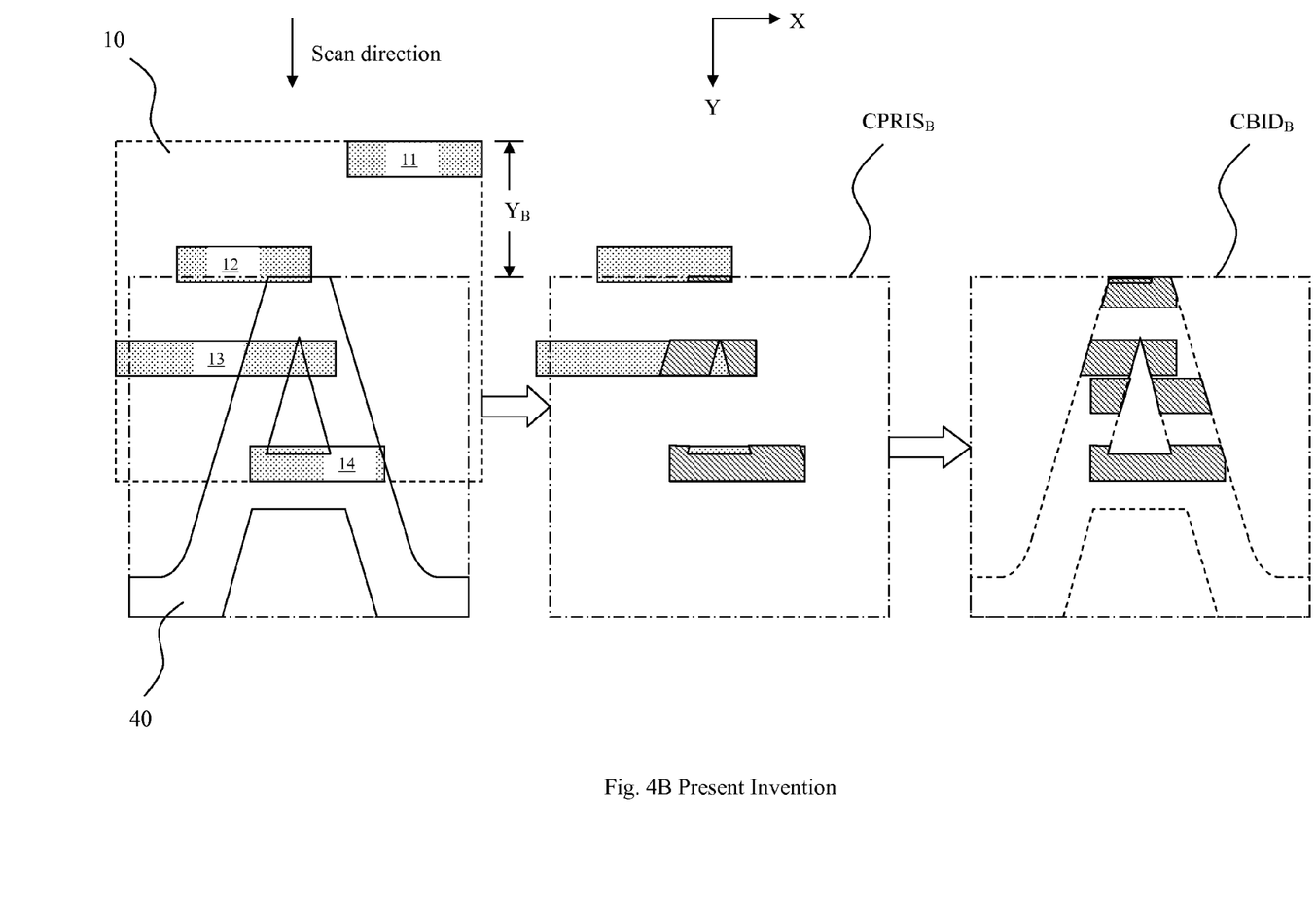
Figure 4C:
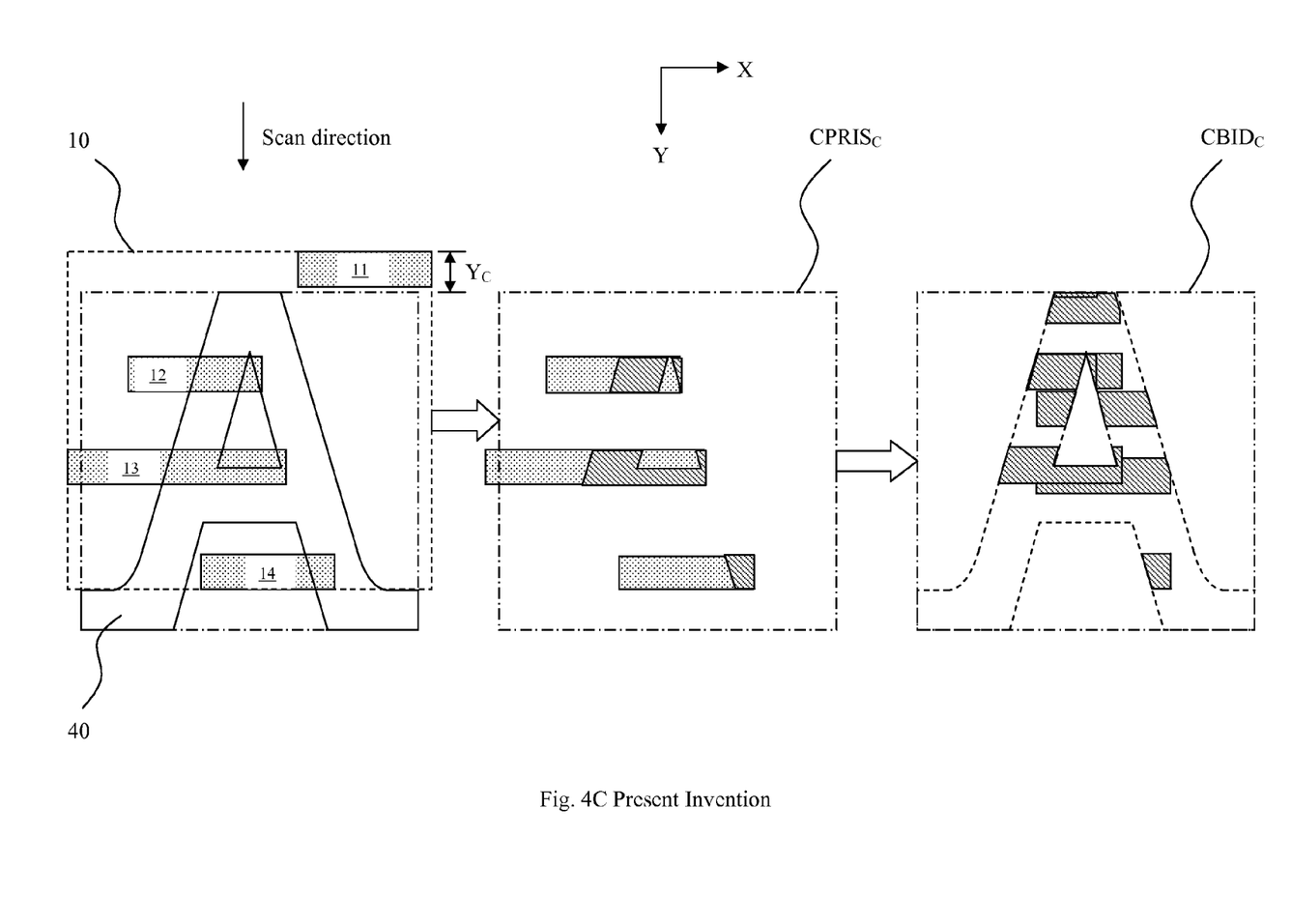
Figure 4D:
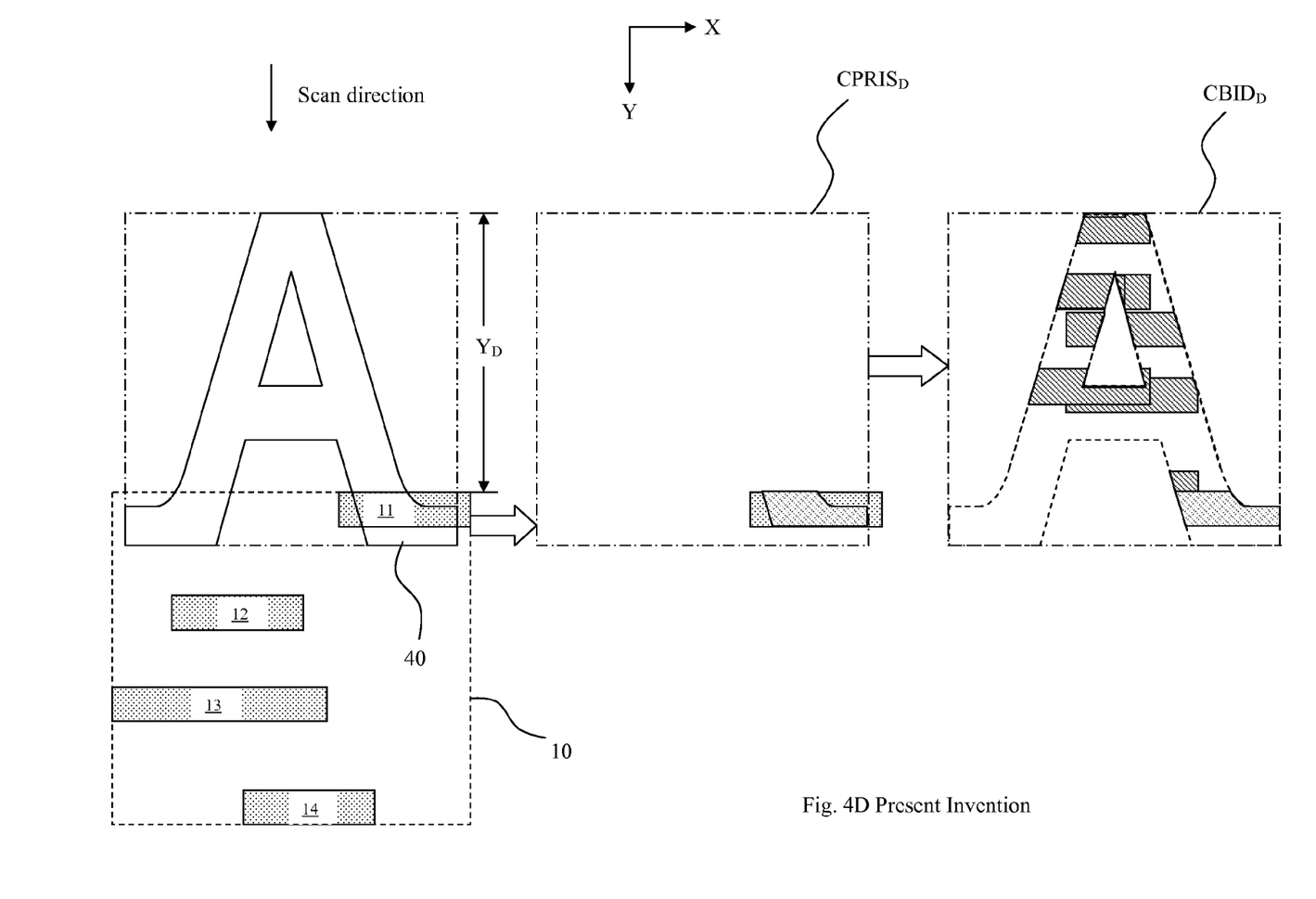
Figure 4E:
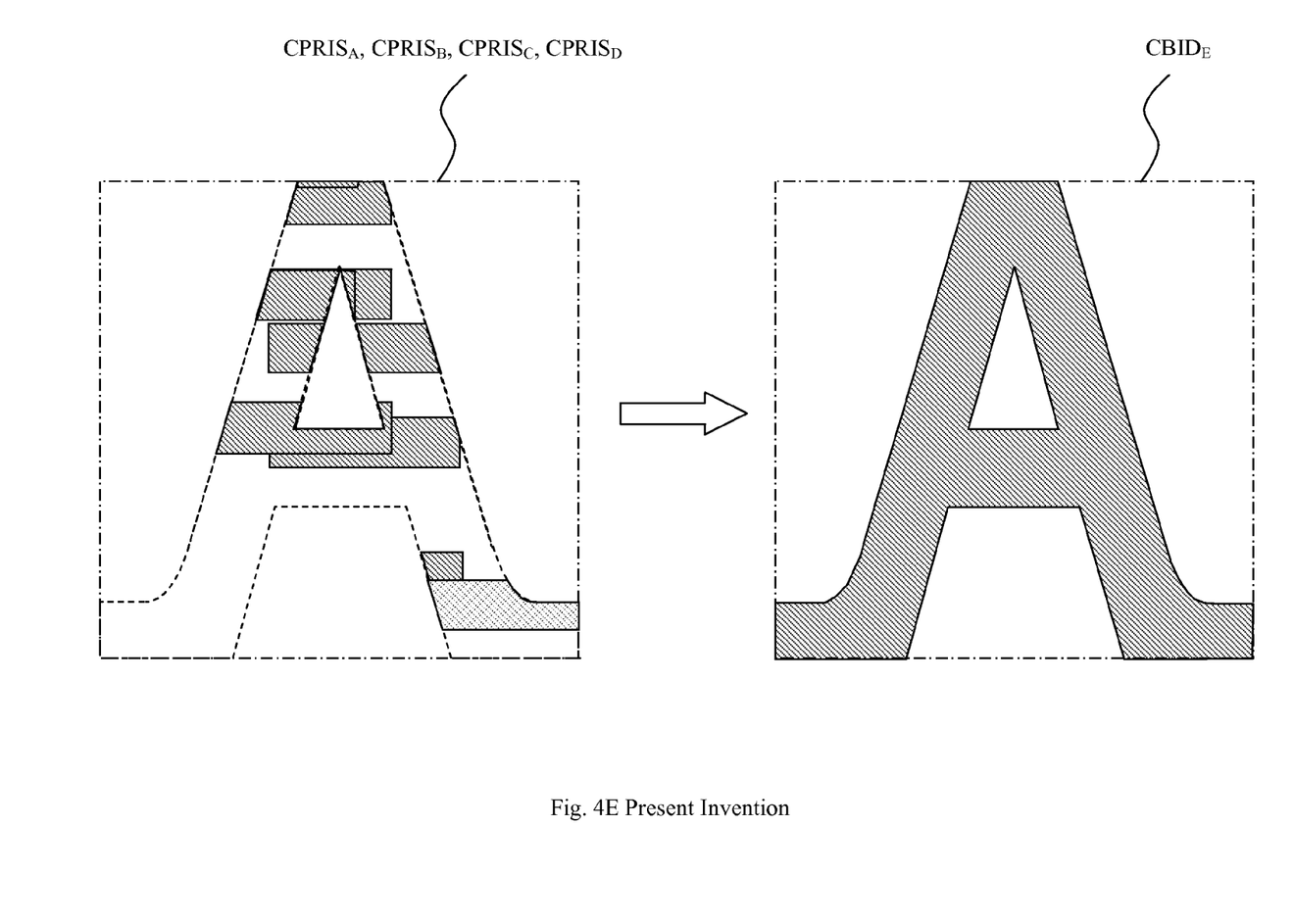

FIG. 3 is a side-by-side illustration of the IMFM 40 to be scanned together with the 4-pixel row WCISC 10. The specific image of the IMFM 40 is a large capital letter "A". FIG. 4A through FIG. 4E illustrate an excerpted sequence of scanning the areal IMFM 40 of large capital letter "A" till completion using the example 4-pixel row WCISC 10 together with the other elements of the top level system block diagram depicted in FIG. 2. In FIG. 4A the 4-pixel row WCISC 10 has moved to a scan position $Y_A$ along the Y-axis with respect to the IMFM 40 with the pixel row image signals (PRIS$_3$, PRIS$_4$) from imaging pixel rows (PXRW$_3$ 13, PXRW$_4$ 14) forming a composite pixel row image signal CPRIS$_A$ to the image data buffer 32 having a cumulative buffered image data CBID$_A$. In FIG. 4B the 4-pixel row WCISC 10 has moved to a scan position $Y_B$ along the Y-axis with respect to the IMFM 40 with the pixel row image signals (PRIS$_2$, PRIS$_3$, PRIS$_4$) from imaging pixel rows (PXRW$_2$ 12, PXRW$_3$ 13, PXRW$_4$ 14) forming a composite pixel row image signal CPRIS$_B$ to the image data buffer 32 now having a cumulative buffered image data CBID$_B$. In FIG. 4C the 4-pixel row WCISC 10 has moved to a scan position $Y_C$ along the Y-axis with respect to the IMFM 40 with the pixel row image signals (PRIS$_2$, PRIS$_3$, PRIS$_4$) from imaging pixel rows (PXRW$_2$ 12, PXRW$_3$ 13, PXRW$_4$ 14) forming a composite pixel row image signal CPRIS$_C$ to the image data buffer 32 now having a cumulative buffered image data CBID$_C$. In FIG. 4D the 4-pixel row WCISC 10 has moved to a scan position $Y_D$ along the Y-axis with respect to the IMFM 40 with the pixel row image signal (PRIS$_1$) from imaging pixel row (PXRW$_1$ 11) forming a composite pixel row image signal CPRIS$_D$ to the image data buffer 32 now having a cumulative buffered image data CBID$_D$. FIG. 4E illustrates the completion of scanning the areal IMFM 40 of large capital letter "A" with a composition of all the composite pixel row image signals (CPRIS$_A$, CPRIS$_B$, CPRIS$_C$, CPRIS$_D$) and the now completed cumulative buffered image data CBID$_D$ to be read by the image data readout 34.

Figure 5A:
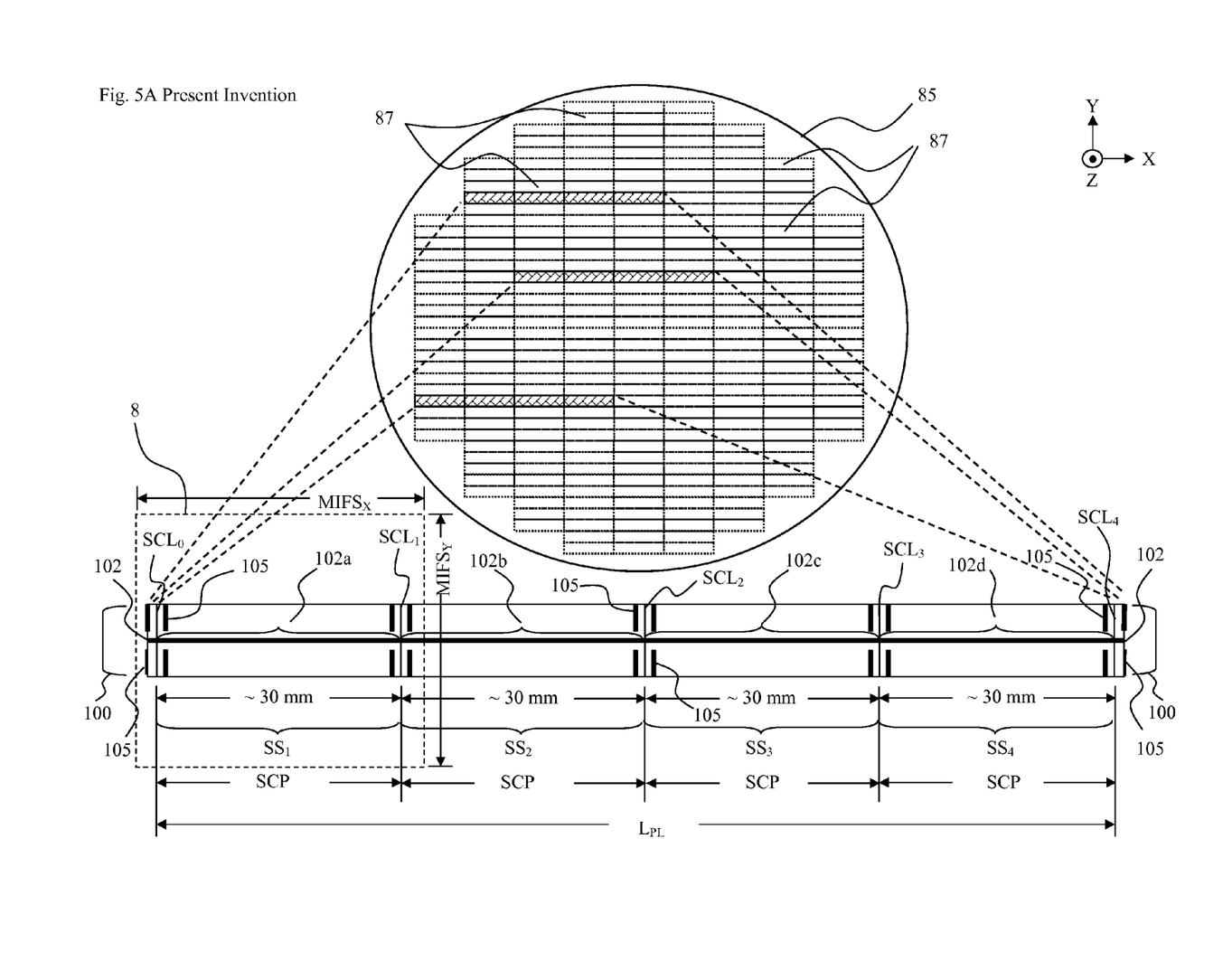
FIG. 5A through FIG. 5C are some key figures excerpted from U.S. Ser. No. 12/506,254 closely related to the present invention.
Figure 5B:
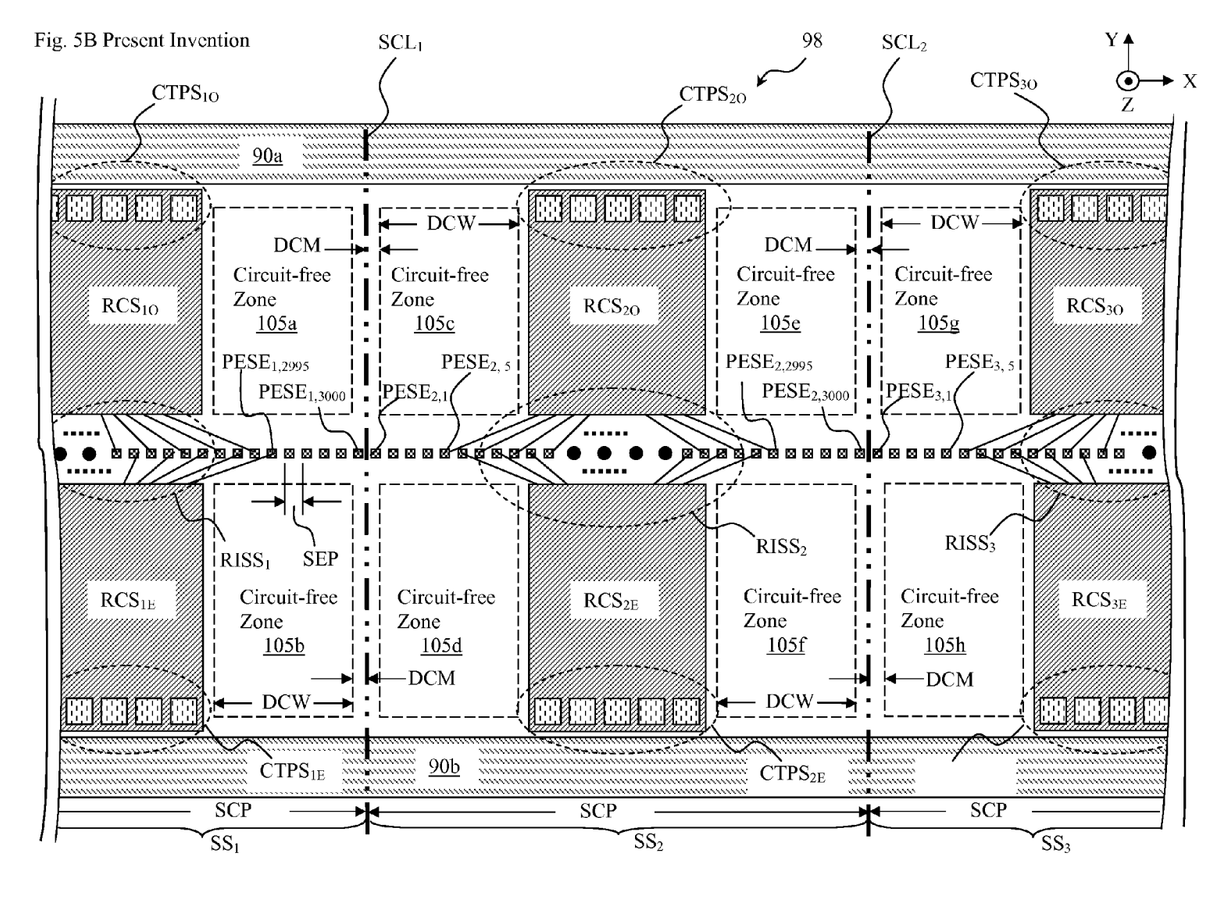
Figure 5C:
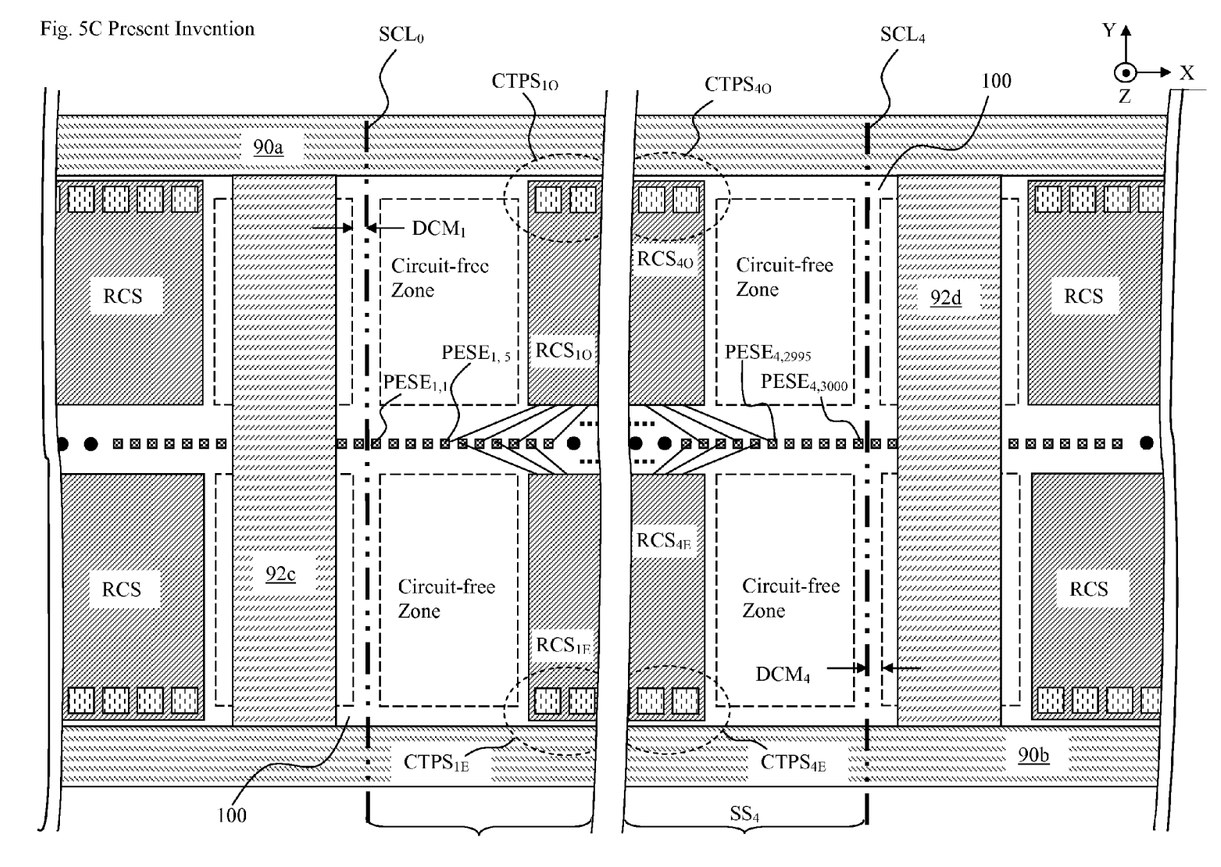

FIG. 5A through FIG. 5C are some key figures excerpted and renumbered from FIG. 1 through FIG. 3 of U.S. Ser. No. 12/506,254 forming another key aspect of the present invention. In fact, for brevity of description of the present invention, all contents of U.S. Ser. No. 12/506,254 are incorporated herein by reference. In essence, each row (row-1, row-2, row-3 or row-4) of the 4-pixel row WCISC 10 itself is a linear image sensor with gapless pixel line and signal readout circuit segments. The linear image sensor converts a pixel line image (PLI) of length LPL into line image signal (LIS). The linear image sensor includes a linear array of sensor segments. Each sensor segment includes a gapless local pixel line segment (LPLS$_j$) of sensing elements. The LPLS$_j$ converts portion of the PLI into a raw image segment signal set (RISS$_j$). The LPLS$_j$ set forms a gapless global pixel line (GPL) corresponding to PLI. The sensor segment also includes readout circuit segment (RCS$_j$) coupled to LPLS$_j$ for processing RISS$_j$ into a readout image segment signal set (ROSS$_j$). The RCS$_j$ has a set of contact pads (CTP$_j$) for off-chip interconnection. Upon off-chip interconnection of the CTP$_j$ set thus composing the ROSS$_j$ set into LIS, the linear image sensor functions as a key part of the 4-pixel row WCISC 10. At this point it is also important to point out that, for example, the imaging pixel row PXRW$_2$ 12 is a selected portion, following a wafer level functionality verification, of the linear image sensor row-2, etc.

Figure 6A:
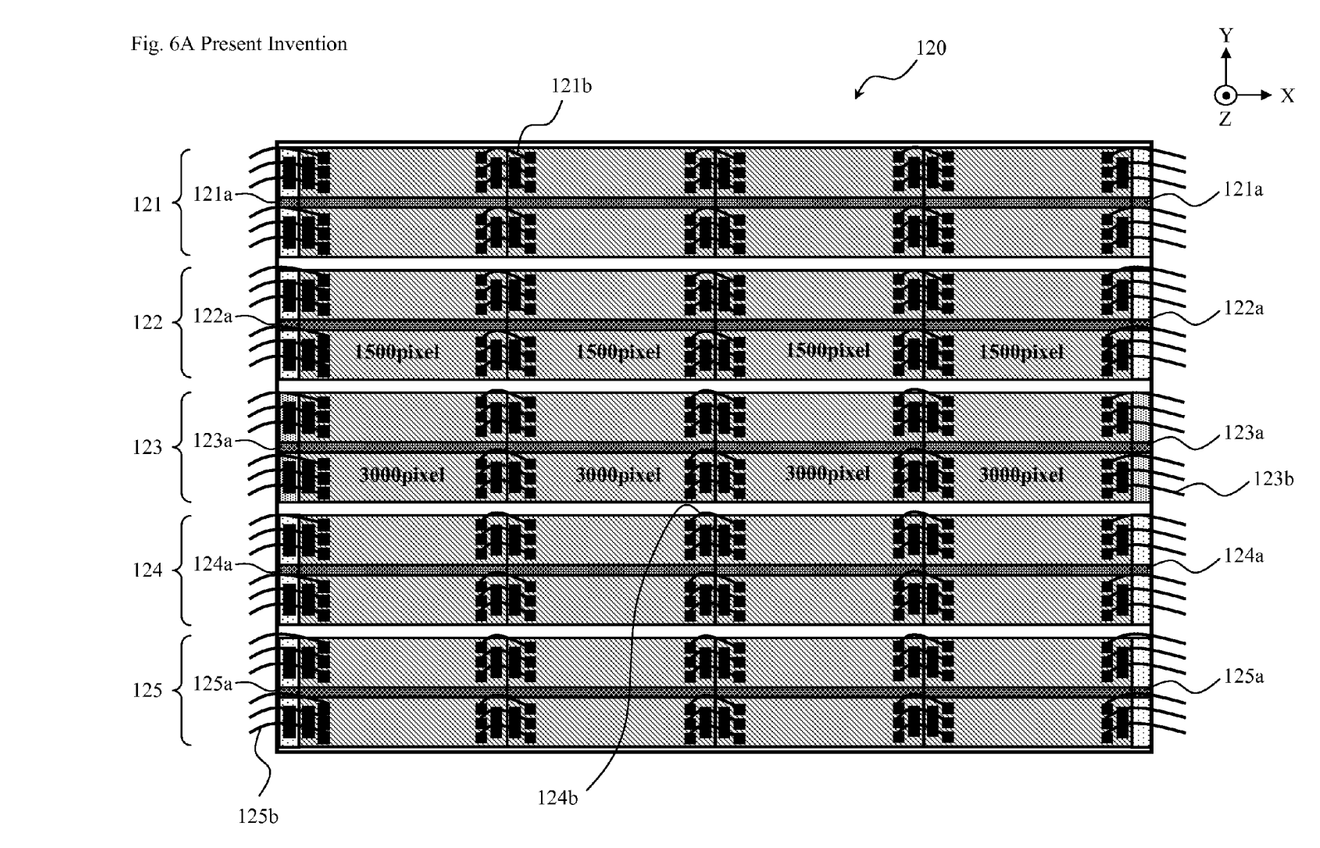
FIG. 6A illustrates another specific embodiment of the present invention multi-pixel row wafer-scale cluster image sensor chip.

FIG. 6A illustrates a 5-pixel row WCISC 120 that is another specific embodiment of the present invention multi-pixel row wafer-scale cluster image sensor chip. Here, the functionally verified imaging pixel rows are PXRW$_1$ 121, PXRW$_2$ 122, PXRW$_3$ 123, PXRW$_4$ 124 and PXRW$_5$ 125 spaced uniformly along the Y-direction. The five (5) imaging pixel rows are of equal pixel row width with no X-direction offset from one another. The PXRW$_1$ 121 has a gapless global pixel line (GPL) 121a. The PXRW$_2$ 122 has a GPL 122a. The PXRW$_3$ 123 has a GPL 123a. The PXRW$_4$ 124 has a GPL 124a. The PXRW$_5$ 125 has a GPL 125a. The following are some examples of off-chip signal interconnection:

Off-chip signal interconnect 121b for PXRW$_1$ 121.
Off-chip signal interconnect 124b for PXRW$_4$ 124.
Off-chip signal interconnect 125b for PXRW$_5$ 125.

As another more specific embodiment of the present invention, the 5-pixel row WCISC 120 can include a set of row-specific color filters atop the GPL 121a, GPL 122a, GPL 123a, GPL 124a and GPL 125a so as to make the 5-pixel row WCISC 120 a key component of a color IMFM imager system.

Figure 6B:
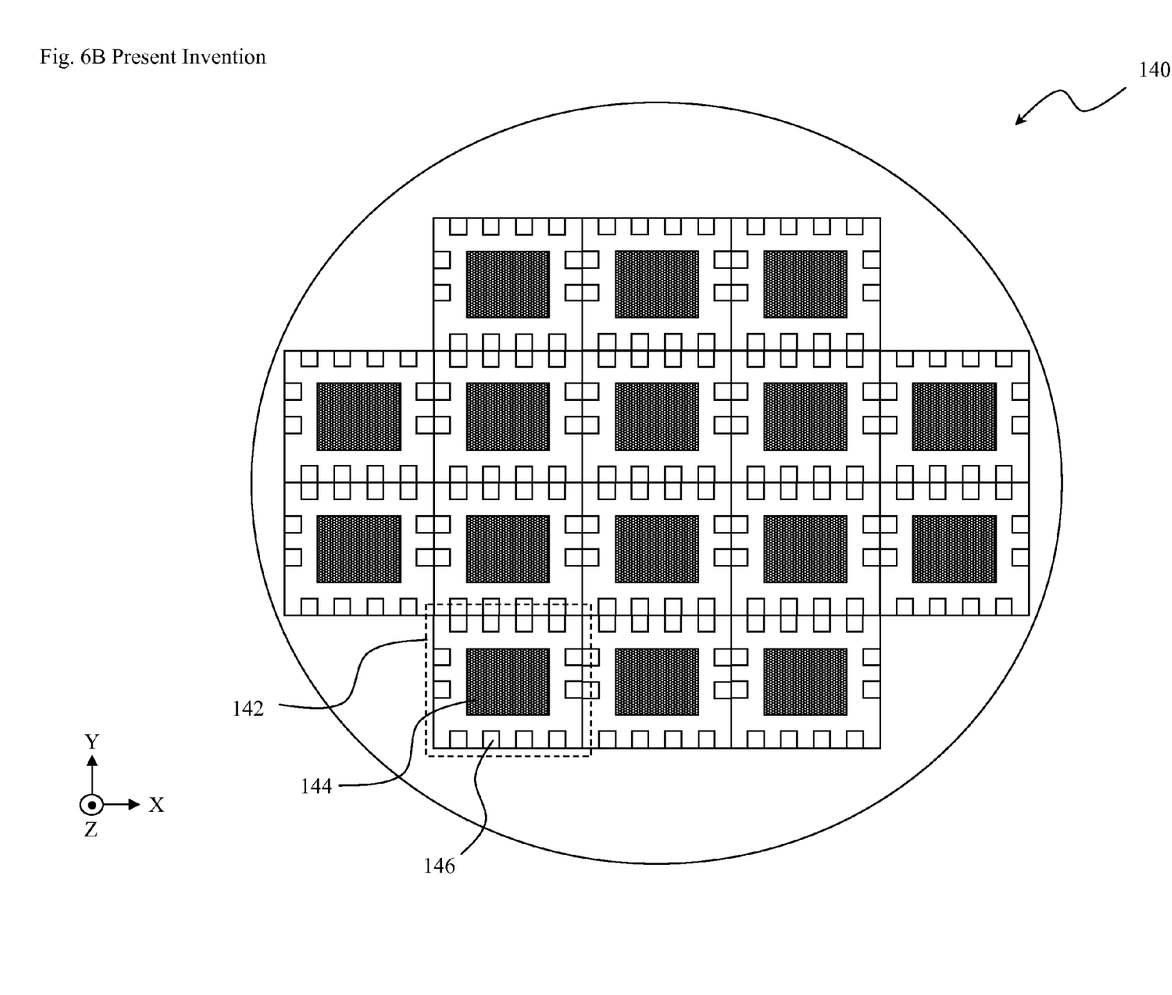
FIG. 6B illustrates a third embodiment of the present invention multi-pixel row wafer-scale cluster image sensor chip in a two-dimensional layout at the wafer level.

FIG. 6B briefly illustrates another embodiment of the present invention multi-pixel row wafer-scale cluster image sensor chip in a two-dimensional layout at the wafer level. Here, a wafer 140 is mapped into numerous two-dimensionally contiguous mask imaging fields, for example 142. Each mask imaging field contains a photoelectrical sensing area (example 144) and peripheral off-chip signal interconnect pads (example 146). To maintain a good lithographic mask imaging throughput during its wafer manufacturing process, each mask imaging field is sized to be within a maximum allowable imaging field size of a step-and-imaging equipment while the collective size of multiple mask imaging fields is allowed to exceed the maximum allowable imaging field size.

A multi-pixel row wafer-scale cluster image sensor chip is proposed with each pixel row having a gapless pixel line and multiple signal readout circuit segments for high quality and color electronic imaging. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed is:

1. A multi-pixel row wafer-scale cluster image sensor chip (WCISC) for, expressed in an X-Y-Z Cartesian coordinate system with pixel rows of the WCISC oriented along X-axis and its principal chip surface lying in X-Y plane, photoelectrically converting an areal image frame (IMFM), of width IFW and height IFH in X-Y plane, into a corresponding areal image frame signal (AIFS), the WCISC comprises:
   a plurality of imaging pixel rows PXRW1, PXRW2, ..., PXRWi, ..., PXRWM where M>1 with each pixel row PXRWi having numerous photoelectrical sensing elements (PESE) spanning a pixel row width PRWi and producing a corresponding pixel row image signal PRISi, each PXRWi being further offset from PXRW1 along X-direction by a distance XOFSTi; and
   b) spaced from PXRWid along Y-direction by a distance SPid,i such that the X- and Y-extremities of each pixel row PXRW1, ..., PXRWM define the IMFM; and
   the widths PRWi and distances XOFSTi being chosen such that any image pixel sweeping through the IMFM along Y-direction will cross hence will be photoelectrically sensed by at least one imaging pixel row whereby:
      owing to its configurationally flexibility, the WCISC can be made with correspondingly higher wafer level yield thus lower cost; and
      in the presence of a Y-directional relative motion between WCISC and IMFM and an external electronic imaging controller (EEIC) interfacing with the WCISC, the EEIC can extract all the PRISi from the WCISC and reconstruct the AIFS wherein a plurality of imaging pixel rows PXRW1, PXRW2, ..., PXRWi, ..., PXRWM where M>1, the imaging pixel rows are offset along X-direction by distances XOFST2=XOFST3 ... XOFSTM=0 and each PXRWi photoelectrically converts a pixel line image (PLI) of width PRWi into the PRISi, said each PXRWi further comprises an X-direction linear array of contiguous sensor segments SS~, SS2, ..., SS3, ..., SSN (N>1) spaced at a scribe pitch (SCP) wherein each SS3 further comprises:

c) a gapless local pixel line segment (LPLSj) of photoelectrical sensing elements PESEj, PESEj2, ..., PESEjk, ..., PESEjp (P>=I) spaced at a sensor element pitch (SEP) for:

c1) converting a corresponding local segment of said PRISi into a raw image segment signal set (RISSj); and c2) forming a gapless global pixel line (GPL) corresponding to the PRISi; and d) a readout circuit segment (RCSj) coupled to the LPLSj for processing the RISSj into a readout image segment signal set (ROSSj), said RCSj further comprises a set of contact pads (CTPj) for off-chip signal interconnection; upon a pre-determined configuration of off-chip interconnection of the contact pad set (CTP, ..., CTPN) so as to compose the a readout image segment signal set $ROSS_1, \ldots, ROSS_N$ into the PRISi, said each PXRWi functions as a key imaging portion of the WCISC.

2. The WCISC of claim 1 wherein said each $PXRW_i$ further comprises two dicing margins $DCM_1$ and $DCM_N$ located respectively contiguous to $SS_1$ and $SS_N$.

3. The WCISC of claim 2 wherein each $SS_j$ has the same structure in that each $LPLS_j$ and each $RCS_j$ are replicated across $SS_1, SS_2, \ldots, SS_N$.

4. The WCISC of claim 3 wherein, to maintain a good lithographic mask imaging throughput during its wafer manufacturing process, each $SS_j$ is sized to be within a maximum allowable imaging field size of a step-and-imaging equipment while the range of X-extremities of $(PXRW_1, \ldots, PXRW_M)$ is allowed to exceed the maximum allowable imaging field size.

5. The WCISC of claim 1 wherein P>1, said $RCS_j$ further comprises P pixel readout circuits $PRC_{jk}$ (k=1,2, ..., P) each respectively coupled to a corresponding $PESE_{jk}$ and at least one pair of neighboring pixel readout circuits $PRC_{jk}, PRC_{jk+1}$ are, referencing the Y-direction, placed at the opposite side of the $LPLS_j$ whereby relieve an X-direction circuit integration density of the $RCS_j$.

6. The WCISC of claim 5 wherein each $PESE_{jk}$ is a photodiode and each $PRC_{jk}$ further comprises a transfer control switch and a feedback-loop operational amplifier both coupled to the photodiode plus an in-pixel correlated double sampling (CDS) circuit.

7. The WCISC of claim 1 wherein said SEP ranges from about 5 micron to about 100 micron.

8. The WCISC of claim 1 wherein the number of photoelectrical sensing elements P ranges from about 100 to about 1000000.

9. A multi-pixel row wafer-scale cluster image sensor chip (WCISC) for, expressed in an X-Y-Z Cartesian coordinate system with pixel rows of the WCISC oriented along X-axis and its principal chip surface lying in X-Y plane, photoelectrically converting an areal image frame (IMFM), of width IFW and height IFH in X-Y plane, into a corresponding areal image frame signal (AIFS), the WCISC comprises:

a) a plurality of imaging pixel rows PXRW1, PXRW2, ..., PXRWi, ..., PXRWM where M>1 with each pixel row PXRWi having numerous photoelectrical sensing elements (PESE) spanning a pixel row width PRWi and producing a corresponding pixel row image signal PRISi, each PXRWi being further offset from PXRW1 along X-direction by a distance XOFSTi; and b) spaced from PXRWid along Y-direction by a distance SPid,i such that the X- and Y-extremities of each pixel row PXRW1, ..., PXRWM define the IMFM; and the widths PRWi and distances XOFSTi being chosen such that any image pixel sweeping through the IMFM along Y-direction will cross hence will be photoelectrically sensed by at least one imaging pixel row whereby:

owing to its configurationally flexibility, the WCISC can be made with correspondingly higher wafer level yield thus lower cost; and wherein, to maintain a good lithographic mask imaging throughput during its wafer manufacturing process while the range of Y-extremities of a plurality of imaging pixel rows PXRW1, PXRW2, ..., PXRWi, ..., PXRWM where M>1 exceeds a maximum allowable imaging field size of a step-and-imaging equipment, said PXRW, ..., PXRWM are configured and partitioned, along the Y-direction, into a number of contiguous and structurally identical row units each sized to be less than the maximum allowable imaging field size of a step-and-imaging equipment.

10. The WCISC of claim 9 wherein said EEIC is configured to extract all the $PRIS_i$ from the WCISC in parallel so as to reconstruct the AIFS with a correspondingly higher imaging throughput.

11. The WCISC of claim 9 further comprises a set of row-specific color filters atop the $PXRW_1, PXRW_2, \ldots, PXRW_i, \ldots, PXRW_M$ so as to make the EEIC a color IMFM imager.

12. The WCISC of claim 9 wherein the number of imaging pixel rows M is from about 3 to about 10.

13. A method of, as expressed in an X-Y-Z Cartesian coordinate system, photoelectrically converting an areal image frame (IMFM) of width IFW and height IFH in the X-Y plane, into a corresponding areal image frame signal (AIFS), the method comprises:

a) providing a multi-pixel row wafer-scale cluster image sensor chip (WCISC) with:

a1) its pixel rows oriented along X-axis and its principal chip surface lying in X-Y plane; and a2) a plurality of imaging pixel rows PXRWi, PXRW2, ..., PXRWi, ..., PXRWM where M>1 with each pixel row PXRWi having numerous photoelectrical sensing elements (PESE) spanning a pixel row width PRWi and producing a corresponding pixel row image signal PRISi, each PXRWi being further:

a21) offset from PXRWi along X-direction by a distance XOFSTi; and a22) spaced from PXRWi–1 along Y-direction by a distance SPi–1,i such that the X- and Y-extremities of a plurality of imaging pixel rows PXRWi, ..., PXRWM define the IMFM; and the widths PRWi and distances XOFSTi being chosen such that any image pixel sweeping through the IMFM along Y-direction will cross hence will be photoelectrically sensed by at least one imaging pixel row;

b) causing a Y-directional relative motion between WCISC and IMFM; and c) providing an external electronic imaging controller (EEIC) interfacing with the WCISC whereby the EEIC extracts all the PRISi from the WCISC and reconstructs the AIFS;

setting a plurality of imaging pixel rows $PXRW_1 = PXRW_{2-} \ldots = PRW_M$ and the imaging pixel rows are offset along X-direction by distances XOFST2=XOFST3 ... XOFSTM=0 with each PXRWi photoelectrically converting a pixel line image (PLI) of width PRWi into the PRISi;

partitioning each PXRWi along X-direction into a linear array of structurally identical contiguous sensor segments $SS_1, SS_2, \ldots, SS_j, \ldots, SSN$ (N>1) spaced at a scribe pitch (SCP) wherein each SSj further comprises:

d) a gapless local pixel line segment (LPLSj) of photoelectrical sensing elements $PESEj1, PESEj2, \ldots, PESEjk, \ldots, PESEjp$ (P>=1) spaced at a sensor element pitch (SEP) for: d1) converting a corresponding local segment of said PRISi into a raw image segment signal set (RISSj); and d2) forming a gapless global pixel line (GPL) corresponding to the PRISi; and e) a readout circuit segment (RCSj) coupled to the LPLSj for processing the RISSj into a readout image segment signal set (ROSSj), said RCSj further comprises a set of contact pads (CTPj) for off-chip signal interconnection; and with a pre-determined off-chip configuration, interconnecting the contact pad set (CTPj, ..., CTPN) so as to compose the a readout image segment signal set $ROSS_1, \ldots, ROSS_N$ into the PRISi.

14. The method of claim 13 wherein partitioning each $PXRW_i$ along X-direction further comprises, during the WCISC manufacturing process, dicing the WCISC off from a processed wafer with two dicing margins $DCM_1$ and $DCM_N$ located respectively contiguous to the $SS_1$ and the $SS_N$.

15. The method of claim 14 wherein, to maintain a good lithographic mask imaging throughput during the WCISC wafer manufacturing process, sizing each $SS_j$ to be within a maximum allowable imaging field size of a step-and-imaging equipment while allowing the range of X-extremities of $(PXRW_1, \ldots, PXRW_M)$ to exceed the maximum allowable imaging field size.

16. A multi-pixel row wafer-scale cluster image sensor chip (WCISC) for, expressed in an X-Y-Z Cartesian coordinate system with pixel rows of the WCISC oriented along X-axis and its principal chip surface lying in X-Y plane, photoelectrically converting an areal image frame (IMFM), of width IFW and height IFH in X-Y plane, into a corresponding areal image frame signal (AIFS), the WCISC comprises:

a plurality of imaging pixel rows PXRW1, PXRW2, ..., PXRWi, ..., PXRWM where M>1 with each pixel row PXRWi having numerous photoelectrical sensing elements (PESE) spanning a pixel row width PRWi and producing a corresponding pixel row image signal PRISi, each PXRWi being further offset from PXRW1 along X-direction by a distance XOFSTi; and b) spaced from PXRWid along Y-direction by a distance SPid,i such that the X- and Y-extremities of each pixel row PXRW1, ..., PXRWM define the IMFM; and the widths PRWi and distances XOFSTi being chosen such that any image pixel sweeping through the IMFM along Y-direction will cross hence will be photoelectrically sensed by at least one imaging pixel row;

owing to its configurationally flexibility, the WCISC can be made with correspondingly higher wafer level yield thus lower cost; and wherein, to maintain a good lithographic mask imaging throughput during its wafer manufacturing process while the range of Y-extremities of a plurality of imaging pixel rows PXRW1, PXRW2, ..., PXRWi, ..., PXRWM where M>1 exceeds a maximum allowable imaging field size of a step-and-imaging equipment, said PXRW, ..., PXRWM are configured and partitioned, along the Y-direction, into a number of contiguous and structurally identical row units each sized to be less than the maximum allowable imaging field size.

17. A method of, as expressed in an X-Y-Z Cartesian coordinate system, photoelectrically converting an areal image frame (IMFM) of width IFW and height IFH in the X-Y plane, into a corresponding areal image frame signal (AIFS), the method comprises:

a) providing a multi-pixel row wafer-scale cluster image sensor chip (WCISC) with:
  a1) its pixel rows oriented along X-axis and its principal chip surface lying in X-Y plane; and
  a2) a plurality of imaging pixel rows $PXRW_1, PXRW_2, \ldots, PXRWi, \ldots, PXRW_M$ where M>1 with each pixel row PXRWi having numerous photoelectrical sensing elements (PESE) spanning a pixel row width PRWi and producing a corresponding pixel row image signal PRISi, each PXRWi being further:
    a21) offset from PXRWi along X-direction by a distance XOFSTi; and
    a22) spaced from PXRWi−1 along Y-direction by a distance SPi−1,i such that the X- and Y-extremities of a plurality of imaging pixel rows $PXRW_1 = PXRW_{2-} \ldots = PRW_M$ define the IMFM; and the widths PRWi and distances XOFSTi being chosen such that any image pixel sweeping through the IMFM along Y-direction will cross hence will be photoelectrically sensed by at least one imaging pixel row;

b) causing a Y-directional relative motion between WCISC and IMFM; and c) providing an external electronic imaging controller (EEIC) interfacing with the WCISC whereby the EEIC extracts all the PRISi from the WCISC and reconstructs the AIFS;

wherein, to maintain a good lithographic mask imaging throughput during the WCISC wafer manufacturing process, configuring said PXRW1, ..., PXRWM such that the range of Y-extremities of a plurality of imaging pixel rows $PXRW_1 = PXRW_{2-} \ldots = PRW_M$ is less than a maximum allowable imaging field size of a step-and-imaging equipment.

18. A method of, as expressed in an X-Y-Z Cartesian coordinate system, photoelectrically converting an areal image frame (IMFM) of width IFW and height IFH in the X-Y plane, into a corresponding areal image frame signal (AIFS), the method comprises:

a) providing a multi-pixel row wafer-scale cluster image sensor chip (WCISC) with:
  a1) its pixel rows oriented along X-axis and its principal chip surface lying in X-Y plane; and
  a2) a plurality of imaging pixel rows $PXRW_1, PXRW_2, \ldots, PXRWi, \ldots, PXRW_M$ where M>1 with each pixel row PXRWi having numerous photoelectrical sensing elements (PESE) spanning a pixel row width PRWi and producing a corresponding pixel row image signal PRISi, each PXRWi being further:
    a21) offset from PXRWi along X-direction by a distance XOFSTi; and
    a22) spaced from PXRWi−1 along Y-direction by a distance SPi−1,i such that the X- and Y-extremities of a plurality of imaging pixel rows $PXRW_1=PXRW_2=\ldots=PRW_M$ define the IMFM; and the widths PRWi and distances XOFSTi being chosen such that any image pixel sweeping through the IMFM along Y-direction will cross hence will be photoelectrically sensed by at least one imaging pixel row;

b) causing a Y-directional relative motion between WCISC and IMFM; and c) providing an external electronic imaging controller (EEIC) interfacing with the WCISC whereby the EEIC extracts all the PRISi from the WCISC and reconstructs the AIFS;

wherein, to maintain a good lithographic mask imaging throughput during the WCISC wafer manufacturing process while the range of Y-extremities of a plurality of imaging pixel rows $PXRW_1=PXRW_2=\ldots=PRW_M$ exceeds a maximum allowable imaging field size of a step-and-imaging equipment, configuring and partitioning said $PXRW_1, \ldots, PXRW_M$, along the Y-direction, into a number of contiguous and structurally identical row units each sized to be less than the maximum allowable imaging field size.

* * * * *